United States Patent [19]
Brambilla et al.

[11] Patent Number: 5,801,536
[45] Date of Patent: Sep. 1, 1998

[54] TEST METHOD FOR POWER INTEGRATED DEVICES

[75] Inventors: Davide Brambilla, Rho; Giovanni Capodivacca, Castellanza; Fabrizio Stefani, Cardano Al Campo, all of Italy

[73] Assignee: SGS-Thomson Microelectronics S.r.l., Agrate Brianza, Italy

[21] Appl. No.: 574,616

[22] Filed: Dec. 19, 1995

[30] Foreign Application Priority Data

Dec. 30, 1994 [EP] European Pat. Off. .............. 94830592

[51] Int. Cl.$^6$ .................................................. G01R 31/28
[52] U.S. Cl. ............................................ 324/522; 324/763
[58] Field of Search ............................... 324/522, 523, 324/763, 765, 555, 538; 257/48

[56] References Cited

U.S. PATENT DOCUMENTS 5,521,511  5/1996  Lanzi et al. ........................... 324/522

FOREIGN PATENT DOCUMENTS

A-0 622 733  11/1994  European Pat. Off. ......... G06F 11/00

OTHER PUBLICATIONS

European Search Report from European Patent Application 94830592.5, filed Dec. 30, 1995.

*Primary Examiner*—Michael Brock
*Attorney, Agent, or Firm*—Wolf, Greenfield & Sacks, P.C.

[57] ABSTRACT

A method of checking an integrity of an electric power connection between a contact pad of an integrated circuit and a corresponding contact pin in an electronic power device, wherein the electronic power device includes at least one final power stage powered from the respective discrete contact pad connected by means of the electric power connection to the respective contact pin. The method of checking is accomplished by providing a resistive connection between two contact pads of the electronic power device bringing the at least one final power stage, powered from the first contact pad, to a conduction state, measuring the potential difference between the two contact pins connected to the two contact pads, and comparing the potential difference with a predetermined nominal potential difference.

16 Claims, 2 Drawing Sheets

5,801,536

TEST METHOD FOR POWER INTEGRATED DEVICES

BACKGROUND OF THE INVENTION

1. Field of the Invention

This invention relates to a method of testing integrated power devices, and in particular, to a method of checking the integrity of a plural-wire electric connection between a contact pad of an integrated power circuit encapsulated within a package and a corresponding contact pin made available on the package exterior.

The invention concerns in particular an integrated power circuit of the type which either comprises a power stage and signal stage, or two final power stages which are structurally independent and powered through respective discrete contact pads connected by plural-wire electric connections to respective pins of the package, and a means of testing such plural-wire connections for integrity.

2. Discussion of the Related Art

As is known, in integrated power circuits, the connections between certain contact pads of the integrated circuit and corresponding metallic contact pins of the package are provided, for example, by two wires in parallel, in order to increase the maximum current that the connection can accommodate. In this way, the two wires in parallel can accommodate currents of upward of 5 Amps.

For electronic devices which have more than one final power stage, such as certain audio amplifiers which may draw still larger currents, it is preferred that the power connection be split by having each final stage connected to its corresponding supply contact pin by a respective two-wire connection. In normal operation of the device, there would be at least two supply contact pins connected to the same electric potential, that is, either to the supply voltage or the circuit ground.

A problem to note is that, at the end of the fabricating process that yields the integrated power device product, the metallic pins will only be accessible on the package exterior.

Thus, there exists a need to ascertain the integrity and soundness of the two-wire connection welds between the respective contact pad of the integrated circuit and the corresponding metallic pin. This need exists in view of current welding processes yielding a rate of rejects of 50 to 100 ppm (pieces per million). Conventional measuring methods have been in use which provide automatic checking capabilities, and specifically, a measurement of pin-to-pin continuity. Such methods, however, have been unable to discriminate between a faulty connection, wherein a single wire is present, and a sound connection, wherein both wires are present, because the resistance of gold wires is negligible compared to the overall resistance of the circuit being measured.

To overcome this problem, the prior art has proposed a first solution which consists of splitting the contact pad of the integrated circuit into two separate sub-pads connected to the same pin by respective wire connects. This solution permits conventional testing, but has a disadvantage in that it requires the area of the integrated circuit be expanded to accommodate the increased number of contact pads provided. This is undesirable in that the present trend favors enhanced miniaturization of integrated circuits and devices. In addition, certain technological restrictions in circuit layout make this solution impracticable.

Disclosed in European Patent Application 93830186.8, published on Nov. 2, 1994 under No. 0622733, is a second solution for testing two-wire electric connections in integrated power devices. This method provides for a first contact pad, to which a two-wire connection to be checked for integrity is run, connected, via a power diode formed within the integrated circuit, to a second pad made available on the device exterior via a corresponding contact pin.

By having a large (a few Amps) current flowing between the two device contact pins connected to said contact pads, and therefore through the power diode, a power dissipation through the wire connections between the pins and the pads is caused. As is known, a rise in the wire temperature results in the resistance of the wires also increasing in value. Thus, by sampling the change in voltage across the two pins over time, which would vary with the resistance of the wire connections, and comparing such samplings with values obtained by testing a sample device, it becomes possible to determine an intact two-wire connection from a faulty single-wire one.

In general, the last-mentioned method is used for checking the two-wire connections provided at the outputs of power amplifiers since, between the output pad of the final stage and the circuit ground, an intrinsic p-n junction is present which is normally reverse biased. This junction is part of the integrated structure of the final power transistor. Accordingly, it has been found advantageous to use this junction for continuity checks on the two-wire connection at that output. On the other hand, in order to check a two-wire connection provided at a supply contact pin of a power device by this method, it would be necessary to integrate a diode in the integrated circuit which can accommodate currents on the order of 5 Amps, which is a diode of a fairly large size. Where devices having several final power stages powered from different supply pins are involved, it would be necessary to integrate a power diode for each supply pin. Thus, the area of the integrated circuit would be greatly increased by the introduction of components which only are used for testing purposes.

The underlying technical problem this invention addresses is to provide a method and device for checking the integrity of a two-wire electric power connection between a contact pad of an integrated circuit encapsulated within a package and a corresponding contact pin, which allows said connection to be checked from outside the device, in a very short time and without involving any integration of power components in the integrated circuit which would only be useful in a testing stage.

SUMMARY OF THE INVENTION

Accordingly, in a first embodiment of the invention, a method is disclosed for checking an integrity of at least a first electric power connection between a first contact pad of an integrated circuit encapsulated within a package and a corresponding first contact pin, the integrated circuit including a first final power stage, the first contact pad coupled to a power source via the first electric power connection and the first corresponding contact pin, and a second contact pad coupled to a second corresponding contact pin. The method comprises the steps of providing a resistive connection between the first and the second contact pads; bringing the first final power stage to a conduction state; measuring a potential difference between the first contact pin and the second contact pin; and, comparing the potential difference with a predetermined nominal potential difference.

In a second embodiment of the invention, an integrated power device is disclosed which comprises a first final power stage, a first contact pad, coupled to the first final power stage, coupled to a power source via a first electric power connection and a corresponding first contact pin, a second contact pad coupled to a second corresponding contact pin, and a means, disposed between the first contact pad and the second contact pad, for checking an integrity of the first electric power connection.

In a third embodiment of the invention, a method is disclosed for testing an integrity of parallel conductors connected between a first contact pin and a first contact pad of an integrated circuit. The integrated circuit has a second contact pad coupled to a second contact pin, and a resistive element connecting the first contact pad to the second contact pad. The method comprises the steps of driving a first integrated circuit element, connected to the first contact pad, to a conduction state; measuring a potential difference across the first and second contact pins; and comparing the potential difference to a predetermined value.

In a fourth embodiment of the invention, an integrated power device is disclosed which comprises first and second contact pins; a first conductor comprising parallel conductors; a second conductor; and an integrated circuit that comprises a first contact pad connected to the first contact pin via the first conductor; a second contact pad connected to the second contact pin via the second conductor; a first integrated circuit element coupled to the first contact pad; a second integrated circuit element coupled to the second contact pad; and, a resistive element which connects the first contact pad to the second contact pad.

In a fifth embodiment of the invention, an integrated circuit package is disclosed that comprises a first contact pad connected to the first contact pin via the first conductor; a second contact pad connected to the second contact pin via the second conductor; a first integrated circuit element coupled to the first contact pad; a second integrated circuit element coupled to the second contact pad; and, a resistive element which connects the first contact pad to the second contact pad.

BRIEF DESCRIPTION OF THE DRAWINGS

The features of this invention will become apparent from the following detailed description of an embodiment thereof shown, by way of non-limiting example, in the accompanying drawings of which.

DETAILED DESCRIPTION

Figure 1:
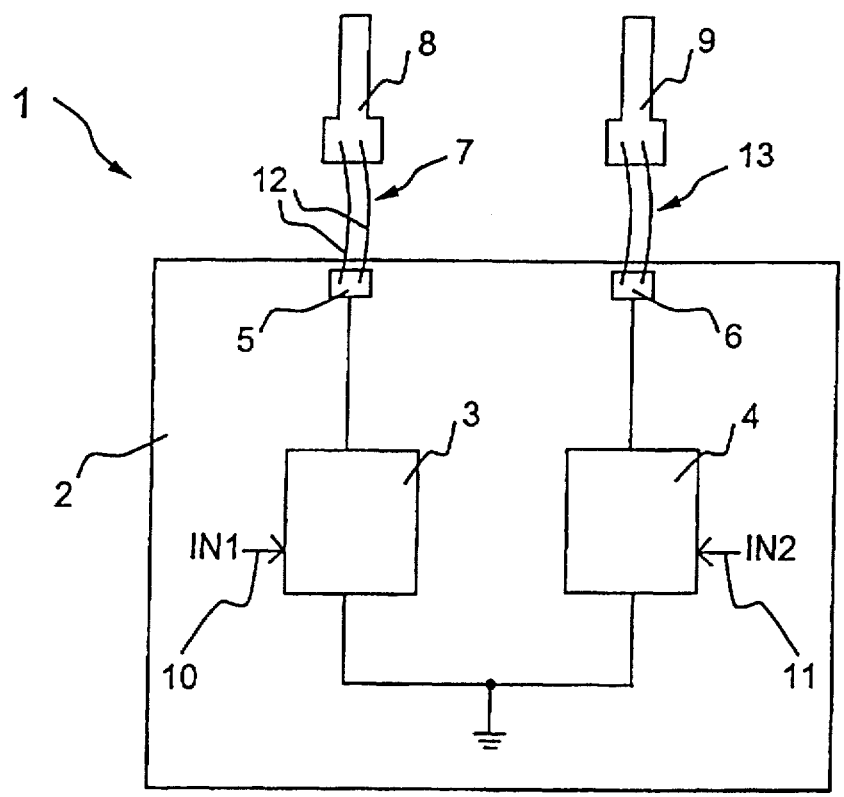
FIG. 1 is a diagram showing schematically a power device of a known type which has two final stages with independent power supplies.

Shown in FIG. 1 is a portion of an electronic power device 1 which incorporates an integrated circuit 2 comprising two final stages 3 and 4 which are independently powered through two contact pins 8 and 9 on the device 1.

In particular, two electric power connections 7 and 13 are shown formed between respective contact pads 5 and 6 of the integrated circuit 2 and corresponding contact pins 8 and 9.

These electric power connections 7 and 13 are two-wire connections, each formed by welding two gold wires 12 on the contact pads 5, 6 of the integrated circuit 2, at one end, and on the contact pins 8, 9 of the device 1, at the other end.

In the device depicted in FIG. 1, both two-wire connections 7 and 13 are used for connecting the final stages 3 and 4 to a positive pole of the supply generator. However, it is to be appreciated that the two-wire connections can be used for connecting the contact pads to any voltage reference, such as the electric ground of the circuit.

The two final stages 3 and 4 can be driven via two inputs 10 and 11. Thus, each final stage can be brought to a conducting state or a cut-off state in an independent manner, from outside the device.

Figure 2:
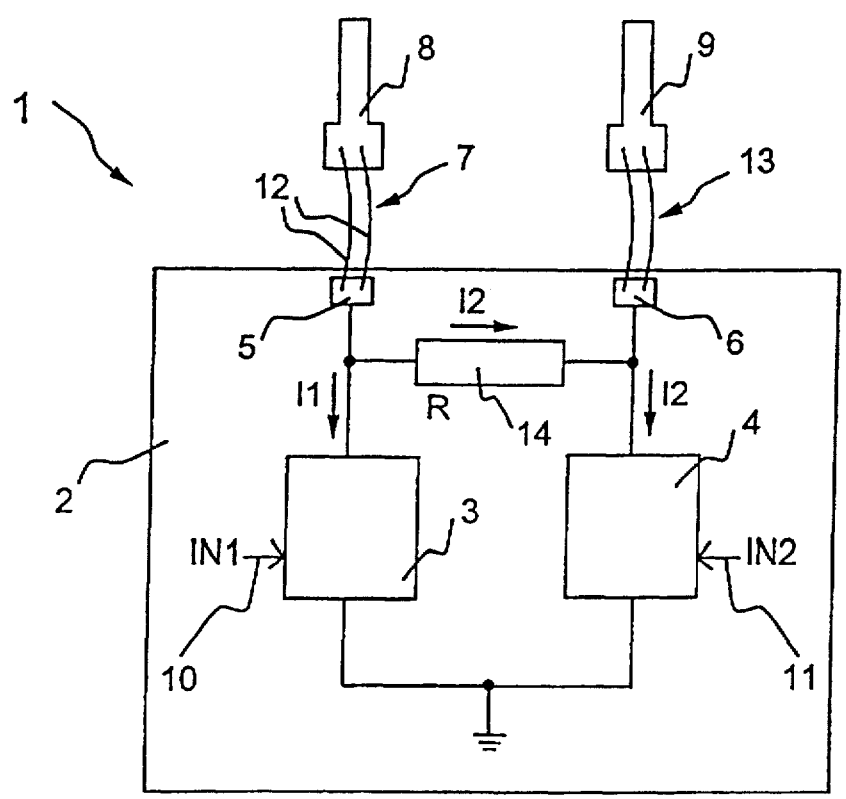
FIG. 2 is a diagram showing schematically a first power device according to the invention, to which the following method is applied.

Shown in FIG. 2 is a portion of a power device 1 incorporating an integrated circuit 2 which has two final stages 3 and 4 with independent power supplies, and including a means 14 of testing two-wire electric connections for integrity in accordance with the invention.

According to the invention, the two contact pads 5 and 6 of the integrated circuit 2 are interconnected by an integrated resistive element 14. It is preferable that this resistive element 14 has a very low value resistance, e.g. 10 Ohms, and as explained hereinafter, have very small currents (tens of milliamps) flowing therethrough. Accordingly, the resistive element can be formed on the integrated circuit in a region of greatly reduced area, where a certain type, e.g. N type, of dopant is diffused.

According to an embodiment of the present invention, the following method is used once to check the first two-wire connection 7 for integrity, and a second time to check the second two-wire connection 13 for integrity.

The first step of the method provides for the device 1 to be powered through the supply contact pin 8, which pin powers the first final stage 3 directly.

The second final stage 4, moreover, is powered through the integrated resistive element 14.

While holding the second final stage 4 in the cut-off state, the first final stage 3 is brought to a state of enhanced conduction by having it draw a large, for example 4 to 5 Amps, current I1 through the supply pin 8. The second final stage will draw, via the resistor 14, a very small current I2, in the 50 mA range. Although examples of sample current values are provided here by way of example, it is to be appreciated that, according to the present invention, any current value required by the final stages of the device 1, can be used.

The current drawn by the supply generator and flowed through the two-wire connection 7 is the sum of the two currents I1 and I2 drawn by the two final stages, and is approximately the current I1 in magnitude.

The second step of the inventive method consists of measuring the potential difference between the two supply pins 8 and 9 of the two final stages. This potential difference is the sum of the voltage drop across the two gold wires of the power connection 7 and the voltage drop across the resistive element 14, given that no current will be flowing through the second power connection 13, so that the potential drop is null thereacross.

The potential difference between the two pins 8 and 9 is given by the following formula, referred to as formula A hereinafter:

$$V = (I1+I2)*Rwire + I2*R \qquad (A)$$

where, Rwire is the resistance of the power connection 7, and R is the resistance of the integrated resistive element 14.

Listed in the chart below are some exemplary values for the electrical quantities used in formula A, respectively in the case of a two-wire connection and a faulty single-wire connection:

|   | 2-wire | 1-wire |   |
|---|--------|--------|---|
| I1 | 5 | 5 | Amps |
| I2 | .05 | .05 | Amps |
| Rwire | 11 E-3 | 22 E-3 | Ohms |
| R | 10 | 10 | Ohms |

From these values, the value of the voltage V can be calculated for either case:

$$V1=(5+0.05)*11E-3+0.05*10=0.555 \text{ Volts}$$

$$V2=(5+0.05)*22E-3+0.05*10=0.611 \text{ Volts}$$

It can be seen that the two voltages V1 and V2 differ by 55 millivolts from each other; therefore, by comparing the voltage value V measured on the device being tested with a value previously measured on a sample device, a good two-wire connection can be discriminated from a faulty single-wire connection.

Using the same procedure, the second two-wire connection 13 can be checked for integrity by powering the device 1 through the supply pin 9 which powers the second final stage 4 directly. Consequently, the first final stage 3 will be powered via the integrated resistive element 14.

Thereafter, while holding the first final stage 3 in the cut-off state, the second final stage 4 is brought to a state of enhanced conduction, and the potential difference between the two supply pins 8 and 9 of the two final stages is measured.

By comparing this voltage value with a value previously measured on a sample piece, a good two-wire connection can be discriminated from a faulty single-wire connection, similar to the foregoing method.

To summarize, the above-described method and device allow devices which have a wire missing from or damaged in a two-wire connection, to be located in a positive manner. Thus, a high degree of quality and reliability can be ensured for the device that tests normal. These results are obtained while achieving a significant savings in area of the integrated circuit compared to prior art solutions.

In particular, the solution described requires very simple testing equipment, and the test can be completed in a very short time.

It will also be appreciated that changes and modifications may be made unto the method and device herein described and illustrated, without departing from the scope of this invention. For example, it is to be appreciated that the method used can be applied to any pair of equipotential contact pins on the device; more specifically, it can be used to check power connections between two ground contact pads of the integrated circuit and two respective ground contact pins on the device.

Figure 3:
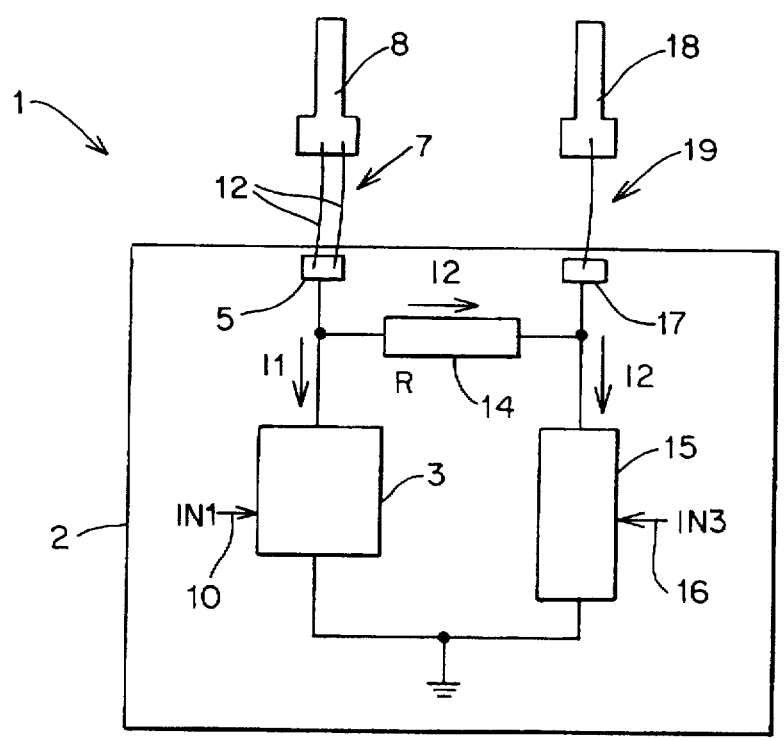
FIG. 3 is a diagram showing schematically a second power device according to the invention, to which the following method is applied.

It is also to be appreciated that this method can be applied to any pair of equipotential contact pins on any device. As an example, this method may be applied to a power device 1, shown schematically in FIG. 3, which incorporates an integrated circuit 2 having a final power stage 3 and a signal stage 15 powered through two independent equipotential contact pins 8 and 18, and including a means 14 of checking a two-wire electric connection for integrity.

For this device to be tested, it is preferable that the connection 7 between the contact pad 5, through which the power stage 3 is powered, and the contact pin 8 is provided by a double wire 12, whereas the connection 19 between the contact pad 17, through which the signal stage 15 is powered, and the contact pin 18 is provided by a single wire.

According to the present invention, the two contact pads 5 and 17 of the integrated circuit 2 are connected to each other through an integrated resistive element 14.

In order to check the two-wire electric connection 7 for integrity, the device 1 is powered through the supply pin 8, which pin powers the final stage 3 directly.

The signal stage 15 will, therefore, be powered through the integrated resistive element 14, and will draw a small current, denoted by I2 in the Figure, via this resistor 14.

The final power stage 3 is then brought to a state of enhanced conduction, causing it to draw a large current I1 from the supply pin 8, and the potential difference between the two pins 8 and 9 is measured.

By comparing this voltage value with a value previously measured on a sample piece, a good two-wire connection can be discriminated from a faulty single-wire connection, the same as in the previously described embodiment.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of checking an integrity of at least a first electric power connection between a first contact pad of an integrated circuit encapsulated within a package and a corresponding first contact pin, said integrated circuit including a first final power stage and a second final power stage, the first contact pad coupled to a power source via the first electric power connection and the first corresponding contact pin, and a second contact pad coupled to the second final power stage and a second corresponding contact pin, the method comprising the steps of:

(A) providing a resistive connection between the first and the second contact pads;

(B) bringing the first final power stage to a conduction state and holding the second final power stage in a cut-off state so that the second final power stage draws a predetermined nominal current from the first contact pad through said resistive connection;

(C) measuring a potential difference between the first contact pin and the second contact pin; and (D) comparing the potential difference with a predetermined nominal potential difference.

2. The method according to claim 1, wherein said resistive connection is integrated on the integrated circuit and has a low resistance value.

3. The method according to claim 2, wherein the potential difference between the first and second contact pins is a sum of a voltage drop across the first electric power connection and a voltage drop across said integrated resistive element.

4. The method according to claim 2, wherein the second contact pad is coupled to a power source via a second electric power connection between the second contact pad and the second contact pin, the method further comprising the steps of:

holding the first final power stage in a cut-off state;
   bringing the second final power stage to a conduction state; and
   repeating steps (C) and (D).

5. The method according to claim 1, wherein said resistive connection has a low resistance value.

6. The method according to claim 1, the integrated circuit further comprising a signal stage coupled to the second contact pad, and wherein during step (C) the signal stage draws a known value current from the first contact pad through said integrated resistive element.

7. A method for testing an integrity of parallel conductors connected between a first contact pin and a first contact pad of an integrated circuit, the integrated circuit having a second contact pad coupled to a second contact pin, and a resistive element connecting the first contact pad to the second contact pad, the method comprising the steps of:

(A) driving a first integrated circuit element, connected to the first contact pad, to a conduction state and holding a second integrated circuit element in a cut-off state so the second integrated circuit element draws a nominal current through the resistive element;

(B) measuring a potential difference across the first and second contact pins; and (C) comparing the potential difference to a predetermined value.

8. The method according to claim 7, wherein the second integrated circuit element is a signal stage connected to the second integrated circuit pad, and wherein during step (B) the signal stage draws a known current value through the resistive element.

9. The method according to claim 7, further comprising the step of testing an integrity of a second set of parallel conductors connected between the second contact pad and the second contact pin.

10. The method according to claim 9, wherein the step of testing the integrity of the second set of parallel conductors comprises holding the first integrated circuit element in a cutoff state, driving the second integrated circuit element to a conduction state, and repeating steps (C) and (D).

11. An integrated power device comprising:

first and second contact pins;

a first conductor comprising parallel conductors;

a second conductor, and an integrated circuit comprising:

a first contact pad connected to the first contact pin via the first conductor;

a second contact pad connected to the second contact pin via the second conductor;

a first integrated circuit element coupled to the first contact pad;

a second integrated circuit element coupled to the second contact pad;

a resistive element coupled between the first contact pad and the second contact pad; and means for bringing the first integrated circuit element to conduction and holding the second integrated circuit element in cut-off so that the second integrated circuit element draws a predetermined nominal current from the first contact pad through the resistive element.

12. The device according to claim 11, wherein the second conductor comprises parallel conductors.

13. The device according to claim 11, wherein the first integrated circuit element is a power stage.

14. The device according to claim 13, wherein the second integrated circuit element is a power stage.

15. The device according to claim 13, wherein the second integrated circuit element is a signal stage.

16. A method of checking the integrity of parallel conductors connected between a first contact pin to be coupled to a power supply and a first contact pad of an integrated circuit, the integrated circuit including a first stage coupled to the first contact pad, a second stage coupled to a second contact pad, and a resistive element coupled between the first and second contact pads, the second contact pad is coupled to a second contact pin via a second conductor, the method comprising:

A) driving the first stage into conduction;

B) holding the second stage in cut-off so that the second stage draws only a nominal current;

C) measuring the potential difference across the first and second contact pins, the potential difference being the voltage drop across the parallel conductors added to the voltage drop across the resistive element;

D) comparing the potential difference to a predetermined value to determine whether the potential difference measured in step (C) is indicative of whether the parallel conductors are intact.

\* \* \* \* \*